United States Patent
Ban et al.

[11] Patent Number: 6,104,094
[45] Date of Patent: Aug. 15, 2000

[54] SEMICONDUCTOR DEVICE

[75] Inventors: Hiroyuki Ban, Hazu-gun; Fukuo Ishikawa, Kariya, both of Japan

[73] Assignee: Denso Corporation, Kariya, Japan

[21] Appl. No.: 09/042,728

[22] Filed: Mar. 17, 1998

[30] Foreign Application Priority Data

Mar. 17, 1997 [JP] Japan ................................. 9-063241

[51] Int. Cl.⁷ ................................................ H01L 23/48
[52] U.S. Cl. .......................... 257/781; 257/665; 257/506; 257/386
[58] Field of Search ..................... 257/781, 651, 257/506, 665, 784, 386

[56] References Cited

U.S. PATENT DOCUMENTS

| | | | |
|---|---|---|---|
| 5,449,946 | 9/1995 | Sakakibara et al. | 257/487 |
| 5,557,134 | 9/1996 | Sugisaka et al. | |
| 5,731,620 | 3/1998 | Mori | 257/786 |
| 5,936,289 | 8/1999 | Mori | 257/386 |

FOREIGN PATENT DOCUMENTS

| | | |
|---|---|---|
| 3-195032 | 8/1991 | Japan . |
| 2-2522207 | 5/1996 | Japan . |

*Primary Examiner*—Roy Potter
*Attorney, Agent, or Firm*—Pillsbury Madison & Sutro LLP

[57] ABSTRACT

A pad for input/output signals is formed on a first conductive type insulated island region interposing an insulating film therebetween. The insulated island region is electrically insulated and isolated from other semiconductor regions in a semiconductor substrate. A fixed potential is provided to the insulated island region through an n⁺-type layer and an electrode. As a result, it is possible to prevent noise superimposed on the input/output signals from interfering in the operation of the other semiconductor regions, and to prevent noise produced in the other semiconductor regions from being superimposed on the input/output signals.

39 Claims, 5 Drawing Sheets

US 6,104,094

SEMICONDUCTOR DEVICE

CROSS REFERENCE TO RELATED APPLICATION

This application is based upon and claims priority from Japanese Patent Application No. H. 9-63241 filed Mar. 17, 1997, the contents of which are incorporated herein by reference.

BACKGROUND OF THE INVENTION

1. Field of the Invention

The present invention relates to a semiconductor device and, in particular, to a structure of a pad portion for input/output signals.

2. Description of the Related Art

Conventionally, a pad for input/output signals of a semiconductor device is formed on a semiconductor substrate with an insulating film interposed therebetween. In such a structure, if the insulating property of the insulating film deteriorates due to cracks formed therein, there arises a problem that the input/output signals of the pad leak into the semiconductor substrate. To solve this problem, it has been proposed by, for example, Japanese Patent Application Laid-open No. H. 3-195032 that, as shown in FIG. 9, an insulated island region 3 is formed on a substrate layer 1 of a semiconductor substrate 100. The insulated island region 3 is electrically insulated and isolated from the other portion of the semiconductor substrate 100 by an insulating isolation film 2, and a pad 5 is formed on the insulated island region 3 interposing an insulating film 4 therebetween. As a result, because the insulated island region 3 is located under the pad 5, the input/output signals can be prevented from leaking out of the insulated island region 3.

In the structure as shown in FIG. 9, however, the insulated island region 3 located under the pad 5 is electrically floating from the other portion of the semiconductor substrate 100. As shown by an equivalent circuit in FIG. 10, a capacitor 21 is formed by the insulating film 4 between the pad 5 and the insulated island region 3, and a capacitor 22 is formed by the insulating isolation film 2 between the insulated island region 3 and the substrate layer 1. These capacitors 21 and 22 are in an electrically floating state due to the insulated island region 3. It is noted that numeral 20 represents an internal circuit formed in the other island regions of the semiconductor substrate 100.

When the insulated island region 3 underlying the pad 5 is electrically floating and noise is superimposed on the input/output signals, this noise affects the operation of semiconductor elements in the other semiconductor regions via the insulated island region 3 and the substrate layer 1. Conversely, noise produced in the other semiconductor regions is superimposed on the input/output signals via the substrate layer 1 and the insulated island region 3.

SUMMARY OF THE INVENTION

Accordingly, it is an object of the present invention to provide a semiconductor device in which noise reduction can be carried out in a case where a pad for input/output signals is formed on an insulated island region.

In order to achieve the above-mentioned object, according to the present invention, a pad is formed on a first conductive type insulated island region interposing an insulating film therebetween. The insulated island region is electrically insulated and isolated from other semiconductor regions in a semiconductor substrate, and a fixed potential providing portion provides a fixed potential to the insulated island region. By providing the fixed potential to the insulated island region, it is possible to prevent noise superimposed on input/output signals from interfering in operations of the other semiconductor regions. It is also possible to prevent noise produced in the other semiconductor regions from being superimposed on the input/output signals. The pad receives an input signal to be inputted to a semiconductor circuit formed in the semiconductor device or an output signal to be outputted from a semiconductor circuit formed therein.

It is preferable to form a second conductive type semiconductor layer in the surface of the insulated island region under the pad. The second conductive type semiconductor layer prevents continuity between the pad and the insulated island region, even when cracks are formed in the insulating layer between the pad and the insulated island region. Therefore, it is possible to prevent the input/output signals from leaking into the insulated island region.

The semiconductor device may be so arranged that a pad for input/output signals is formed on a first conductive type insulated island region which is electrically insulated and isolated from other semiconductor regions in a semiconductor substrate, a fixed potential providing portion provides a fixed potential to the insulated island region, and the pad is electrically connected to the insulated island region via a diode using the insulated island region as a constituting element. According to this semiconductor device, noise, which is produced in another semiconductor region and introduced into the pad via the semiconductor substrate and the insulated island region, can be removed by the insulated island region provided with the fixed potential. Noise superimposed on the input/output signals can be removed through the diode.

The diode can be formed by a second conductive type semiconductor layer, which is formed in the surface of the insulated island region, and the first conductive type insulated island region. Further, by forming an opening in the insulating layer between the pad and the insulated island region, the pad can contact the insulated island region (the second conductive type semiconductor layer). In this case, there is junction capacitance between the second conductive type semiconductor layer and the first conductive type insulated island region. As a result, noise superimposed on the input/output signals can be effectively removed due to the junction capacitance and the diode.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF THE PREFERRED EMBODIMENTS

Embodiments of the present invention will now be explained with reference to the drawings.

(First Embodiment)

Figure 1:
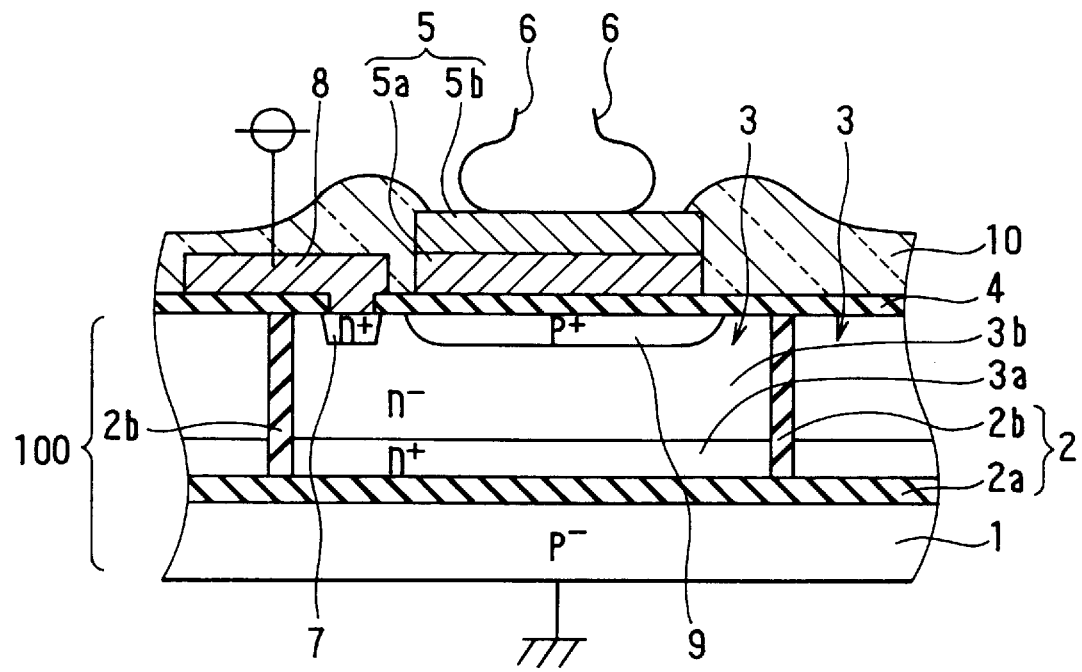
FIG. 1 is a sectional view illustrating a pad portion of a semiconductor device according to a first embodiment of the present invention.
Figure 2:
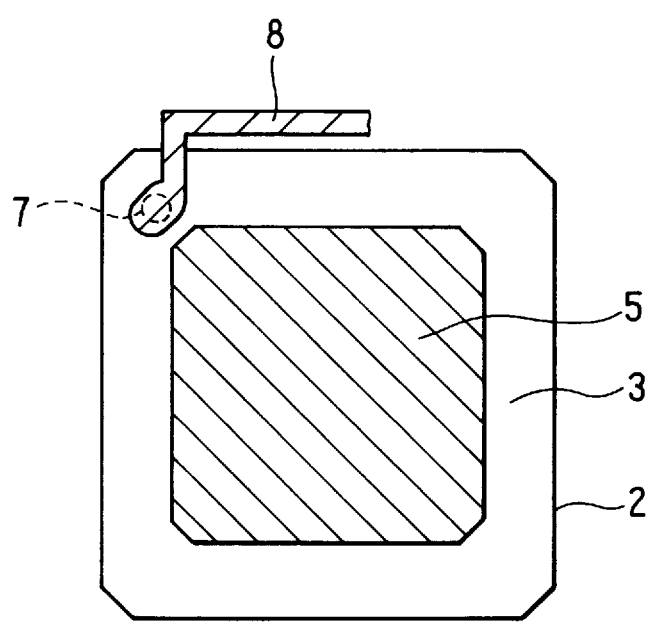
FIG. 2 is a plan view of the pad portion as shown in FIG. 1.

FIG. 1 is a sectional view illustrating a pad portion of a semiconductor device according to a first embodiment of the present invention. FIG. 2 is a plan view of the pad portion.

In the semiconductor device illustrated in FIG. 1, an insulating isolation film 2a consisting of $SiO_2$ (an oxide film) is formed on a P⁻-type substrate 1. On the insulating isolation film 2a, an n⁺-type layer 3a and n⁻-type layer 3b are formed. The n⁺-type layer 3a and n⁻-type layer 3b are insulated and isolated from the neighboring regions by insulating isolation films 2b. That is, the n⁺-type layer 3a and n⁻-type layer 3b constitutes an insulated island region 3 which is electrically insulated and isolated from the other semiconductor regions by the insulating isolation film 2 (2a, 2b). By forming the n⁺-type layer 3a having a high impurity concentration in a bottom portion of the insulated island region 3, when a fixed potential is provided through an n⁺-type layer 7 described later, it is possible to make the electric field of the insulated island region close to uniform. In this way, a semiconductor substrate 100 having a plurality of insulated island regions 3 is constituted by the p⁻-type substrate 1, the insulating isolation film 2 (2a, 2b), and the n⁺-type layer 3a and n⁻-type layer 3b. The plurality of insulated island regions 3 are used as an insulated island region located under a pad for input/output signals and also as an insulated island region in which semiconductor elements constituting an internal circuit 20 are formed.

An insulating film 4 consisting of $SiO_2$ is formed on the semiconductor substrate 100. A pad 5 is formed on the insulating film 4. The pad 5 has a double layer structure of a first aluminum (Al) layer 5a and a second Al layer 5b. On the second Al layer 5b, wires 6 to transmit the input/output signals are bonded.

An n⁺-type layer 7 which is for fixing a potential of the insulated island region 3 to a predetermined potential is formed in the n⁻-type layer 3b. This n⁺-type layer 7 is electrically connected to the potential fixing Al electrode 8 via an opening formed in the insulating film 4. By setting the potential of the potential fixing Al electrode 8 to a maximum potential (power supply voltage), the potential of the insulated island region 3 is fixed to the maximum potential.

In the surface of the n⁻-type layer 3b underlying the pad 5, a p⁺-type layer 9 is formed. By providing the p⁺-type layer 9 in the surface of the n⁻-type layer 3b, even when cracks are produced in the insulating film 4, no continuity between the pad 5 and the n⁻-type layer 3b can be assured. Therefore, it is possible to prevent the input/output signals from leaking into the insulated island region 3. It is to be noted that a protective film 10 is formed on the semiconductor substrate 100 except for a region above the pad 5.

Figure 3:
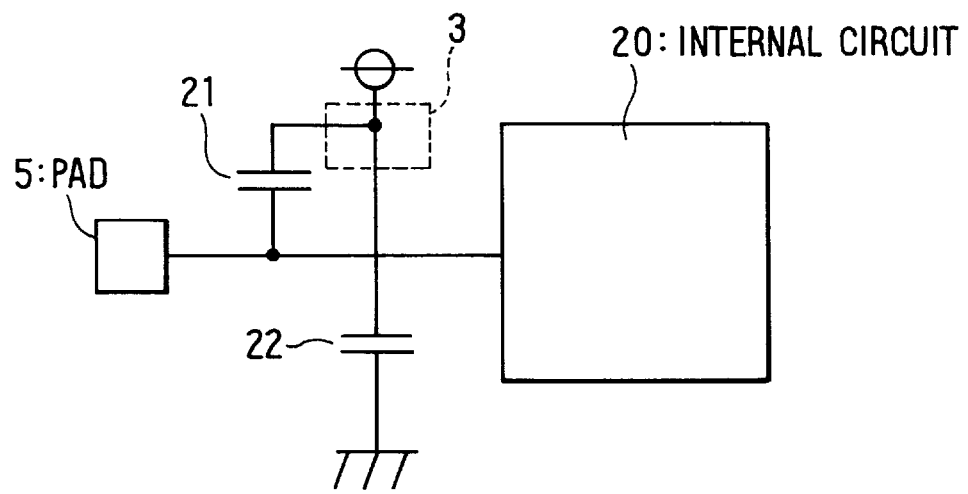
FIG. 3 is an equivalent circuit diagram of the semiconductor device shown in FIG. 1.

FIG. 3 shows an equivalent circuit of the semiconductor device shown in FIG. 1. In this equivalent circuit, a capacitor 21 is formed due to the insulating film 4 between the pad 5 and the insulated island region 3. Also, a capacitor 22 is formed due to the insulating isolation film 2a between the insulated island region 3 and the P⁻-type substrate 1. These capacitors 21 and 22 are connected to the potential fixing Al electrode 8 via the insulated island region 3.

As understood from the equivalent circuit and the structure shown in FIG. 1, by fixing the potential of the insulated island region 3 to the maximum potential, it is possible to cause noise, which is superimposed on the input/output signals or produced in the other semiconductor regions, to escape into a power source supplying the maximum potential via the insulated island region 3 and the potential fixing Al electrode 8. In this way, the pad portion can exhibit a noise removal function. Because the capacity of the capacitance 21 created by the insulating film 4 is about 10 pF, and the capacity of the capacitance 22 created by the insulating isolation film 2 is in a range from 5 pF to 6 pF, the pad portion of the present embodiment is effective as a countermeasure to EMI (electromagnetic interference) with respect to the input/output signals.

Figure 4:
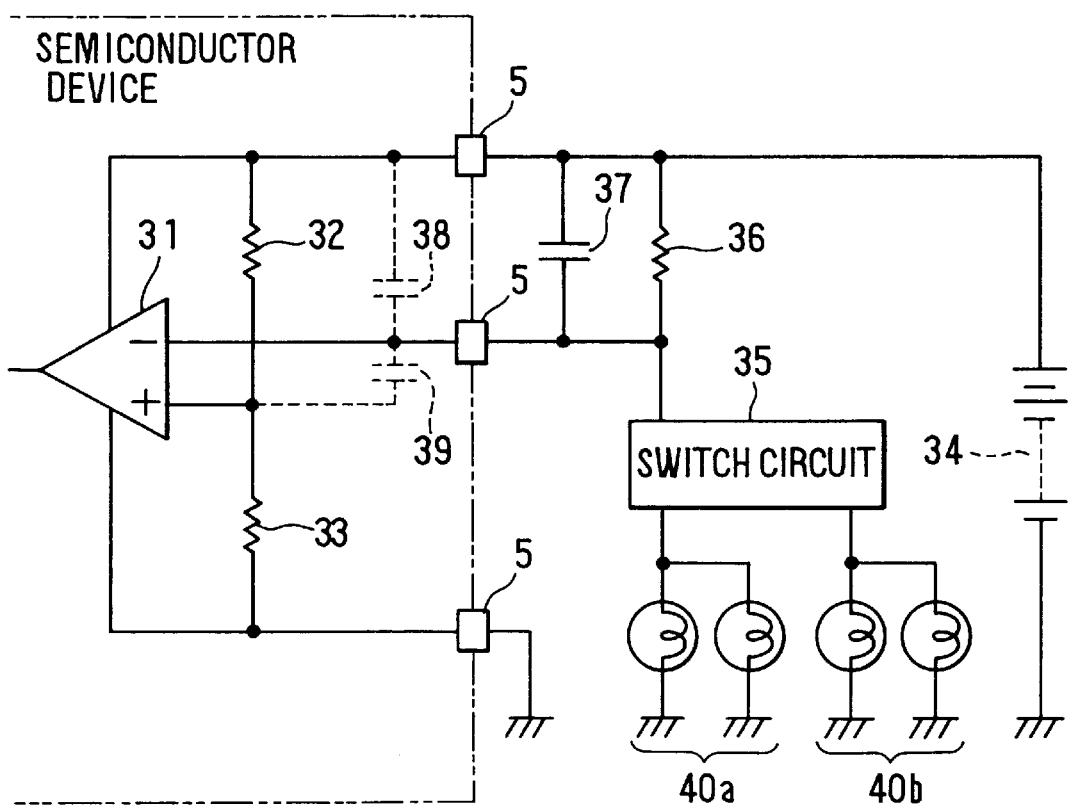
FIG. 4 is a circuit diagram in a case where the semiconductor device shown in FIG. 1 is applied to a lamp disconnection detecting circuit.

FIG. 4 shows a circuit diagram in a case where the above-described semiconductor device is applied to a lamp disconnection detecting circuit. In this case, components such as a comparator 31, and resistors 32, 33 for generating a reference voltage, are formed in the semiconductor device.

A direction indicator for a vehicle has right-side lamps 40a and left-side lamps 40b as shown in FIG. 4. These lamps light up by receiving power from a vehicle-mounted battery 34 via a switch circuit 35. The switch circuit 35 includes a turn switch and a hazard switch, and causes the right-side lamps 40a and/or the left-side lamps 40b to light up in response to the operation of those switches.

A detection resistor 36 for detecting lamp disconnection is disposed in a path through which current flows from the battery 34 to the lamps 40a, 40b. One end of the detection resistor 36 is connected to an inverted input terminal of the comparator 31 through the input pad 5. An external capacitor 37 for removing noise is connected in parallel to the detection resistor 36.

In this lamp disconnection detecting circuit, when the right-side lamps 40a and/or the left-side lamps 40b light up, voltage drop across the detection resistor 36 is monitored. If disconnection has occurred in any one of the lamps, the voltage across the detection resistor 36 becomes small. That is, the voltage inputted to the inverted input terminal of the comparator 31 becomes large so that the output of the comparator 31 is inverted. As a result, lamp disconnection can be detected.

The resistance value of the detection resistor 36 is in a range from 10 mΩ to 20 mΩ, and the voltage detected by the detection resistor 36 is in a range from 40 mV to 60 mV. Because the lamp disconnection detecting circuit deals with such a small voltage signal, if noise is superimposed at the lines connecting both ends of the detection resistor 36 to the semiconductor device, there is a possibility of erroneously detecting lamp disconnection. In the present embodiment, however, since the pad 5 has the noise removal function as described above, detection error in detecting lamp disconnection can be avoided. Although capacitors 38 and 39 for removing noises are built into the conventional semiconductor device as shown by a dotted line in FIG. 4, the present embodiment can dispense therewith, as the pads 5 have the noise removal function. In the present embodiment, however, the built-in capacitors 38 and 39 may be utilized in order to reliably carry out noise removal.

Figure 5:
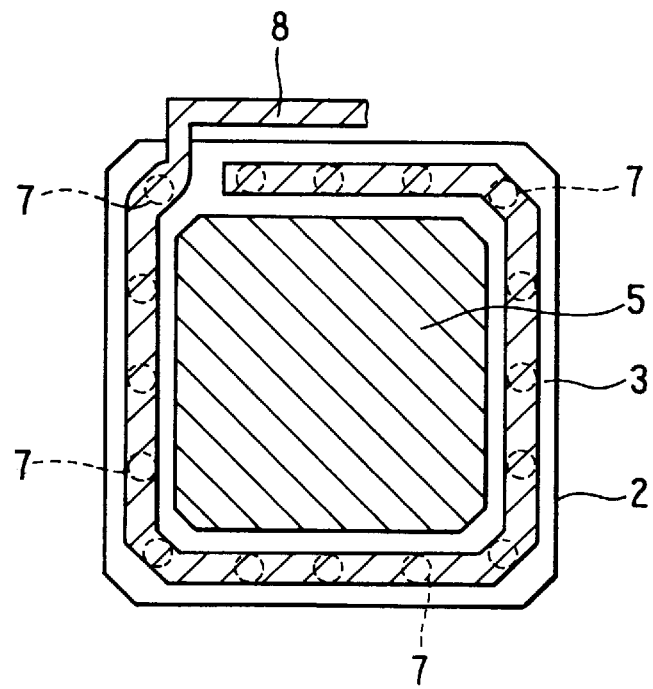
FIG. 5 is a plan view of the pad portion according to a modified version in which an $n^+$-type layer 7 is formed in the periphery of an n⁻-type layer 3b with respect to the pad portion shown in FIG. 2.

The $n^+$-type layer 7 was formed only in a part of the $n^-$-type layer 3b in the above-described embodiment as shown in FIG. 2. However, plural $n^+$-type layers 7 may be formed along the circumference of the $n^-$-type layer 3b. A plurality of openings may also be formed in the insulating film 4, and the $n^+$-type layers 7 may contact the potential fixing Al electrode 8 via the plurality of openings, as shown in FIG. 5. In this case, the electric field can be prevented from concentrating on only one $n^+$-type layer 7.

(Second Embodiment)

Figure 6:
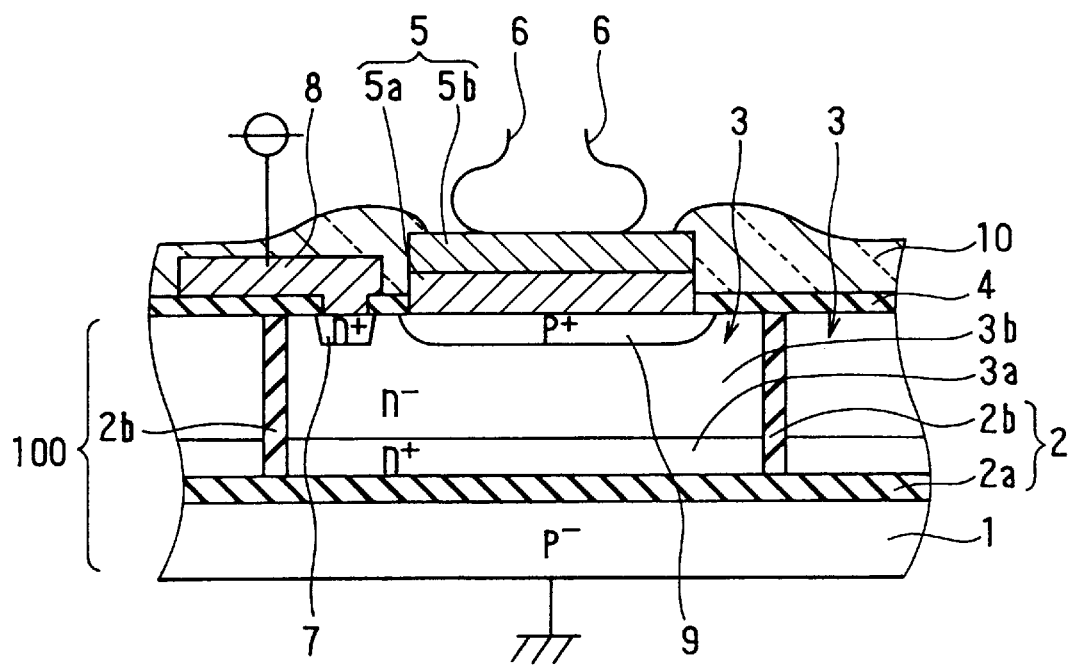
FIG. 6 is a sectional view illustrating a pad portion of a semiconductor device according to a second embodiment of the present invention.

In a second embodiment, as shown in FIG. 6, an insulating isolation film 2 is removed in a region where the pad 5 is to be formed, so that an opening is formed in the insulating isolation film 2. The pad 5 is formed on the $p^+$-layer 9 exposed through the opening. Due to this structure, a parasitic diode for positive surge protection use is formed by the $p^+$-type layer 9 and the $n^-$-type layer 3b.

Figure 7:
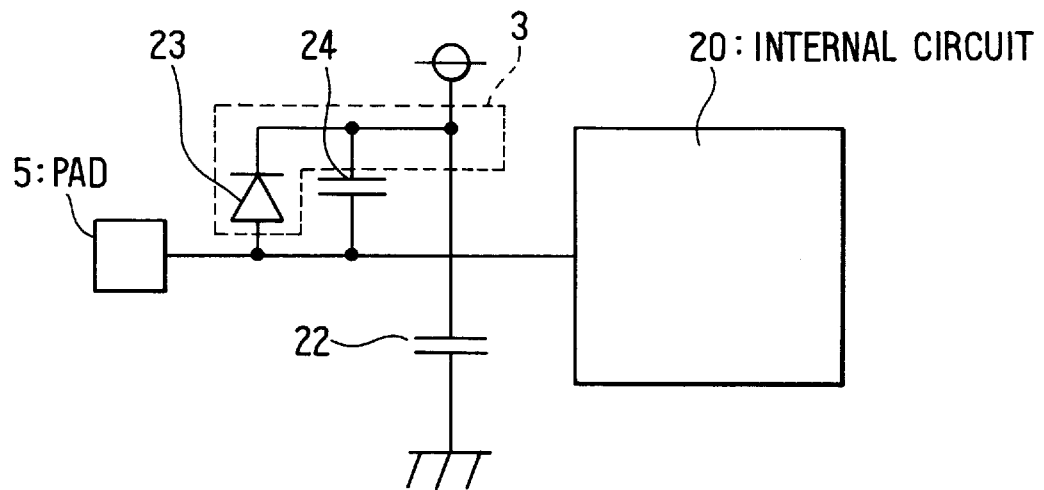
FIG. 7 is an equivalent circuit of the semiconductor device shown in FIG. 6.

FIG. 7 shows an equivalent circuit of the semiconductor device shown in FIG. 6. The pad 5 is electrically connected to the $n^-$-type layer 3b through a diode 23 formed by the $p^+$-type layer 9 and the $n^-$-type layer 3b. Also, there is junction capacitance 24 between the $p^+$-type layer 9 and the $n^-$-type layer 3b. Therefore, input/output signal noise having a potential greater than the maximum potential can escape to a power source side via the diode 23. Also, noise, such as radio noise, having a high frequency can escape to the power source side via the junction capacitance 24.

A metal film can be formed at the opening of the insulating film 4 in place of the $p^+$-type layer 9 so that a schottky-barrire diode is formed between the metal film and the $n^-$-type layer 3b. When the pad 5 is formed on the metal film, the schottky-barrire diode serves as the diode 23.

Figure 8:
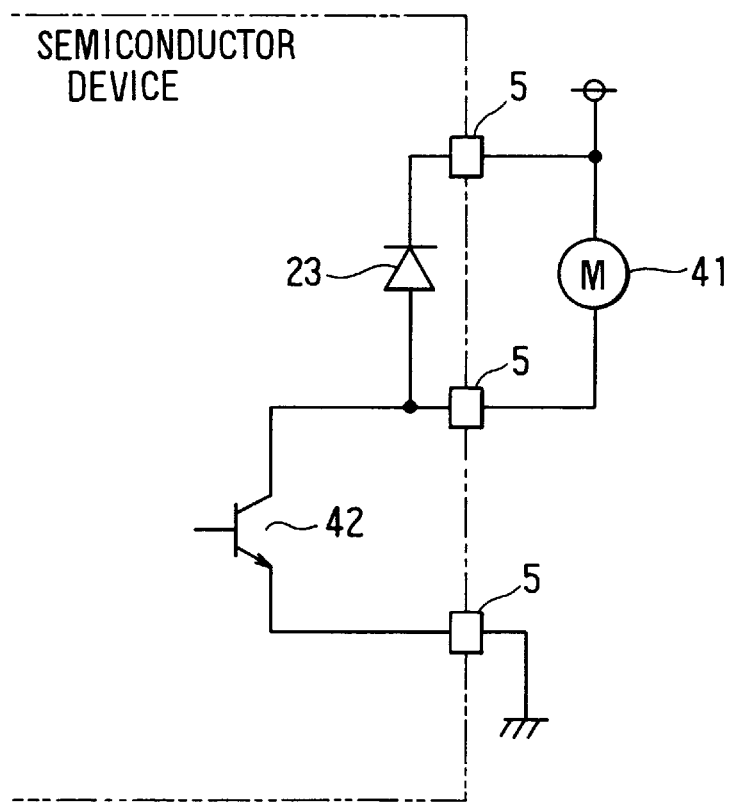
FIG. 8 is a circuit diagram partially illustrating an application of the second embodiment.
Figure 9:
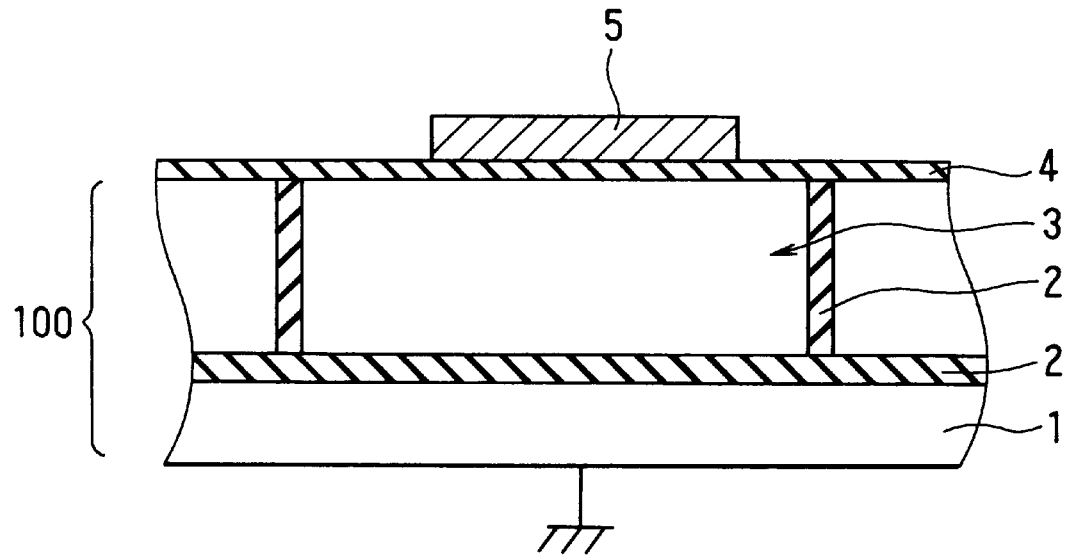
FIG. 9 is a sectional view illustrating a pad portion of a conventional semiconductor device.
Figure 10:
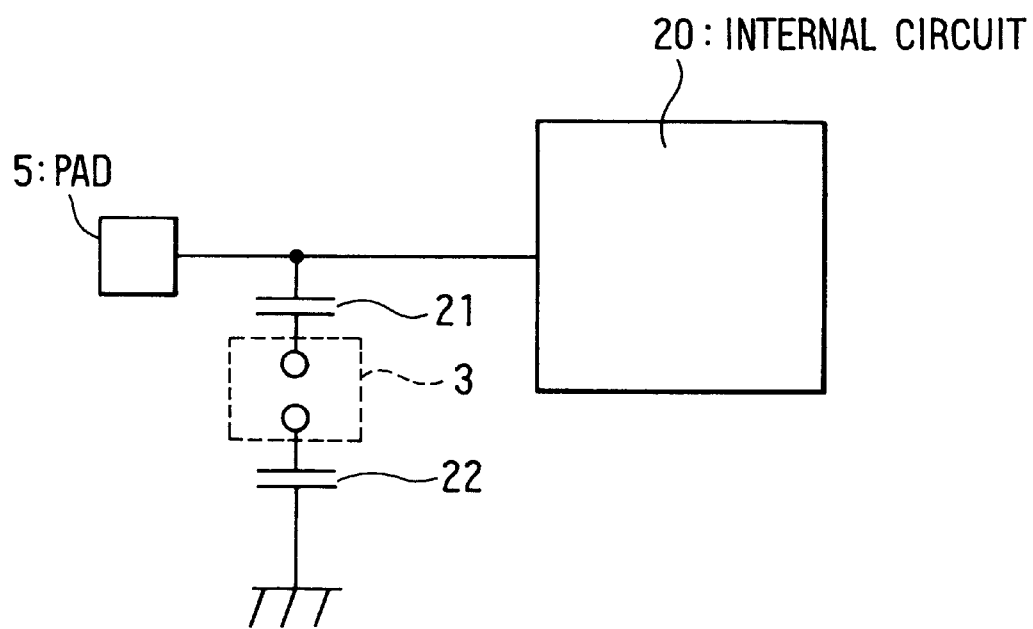
FIG. 10 is an equivalent circuit of the semiconductor device shown in FIG. 9.

The diode 23 can be used as a diode for absorbing flyback voltage of a motor, specifically, as shown in FIG. 8, the pads 5 serving as a output terminal are connected to the motor 41. When a transistor 42 controls the motor 41, the flyback voltage is absorbed by the diode 23.

In the first and second embodiments, the semiconductor device can be constituted even when p-type and n-type of various layers are switched. In such a case, however, the insulated island region 3 is fixed to a minimum potential (for example, ground potential).

Also, the pad 5 may have a single Al layer structure instead of the double layer structure.

What is claimed is:

1. A semiconductor device comprising:
   a semiconductor substrate having a first conductive type insulated island region which is insulated and isolated from other semiconductor regions therein by an insulating isolation film;
   a pad formed on the first conductive type insulated island region interposing an insulating film therebetween; and
   a fixed potential providing portion for providing a fixed potential to the first conductive type insulated island region.

2. A semiconductor device according to claim 1, further comprising a second conductive type semiconductor layer formed in a surface of the first conductive type insulated island region located under the pad.

3. A semiconductor device according to claim 1, wherein the pad receives an input signal to be inputted to a semiconductor circuit formed in the semiconductor device or an output signal to be outputted from a semiconductor circuit formed therein.

4. A semiconductor device according to claim 1, wherein the fixed potential providing portion comprises a first conductive type semiconductor region formed in a surface of the insulated island region and an electrode which is in contact with the semiconductor region and receives the fixed potential from a power source.

5. A semiconductor device according to claim 4, wherein the semiconductor region has an impurity concentration higher than that of a surface portion of the insulated island region.

6. A semiconductor device comprising:
   a semiconductor substrate having a first conductive type insulated island region which is insulated and isolated from other semiconductor regions therein by an insulating isolation film;
   a pad formed on the first conductive type insulated island region interposing an insulating film therebetween; and
   a fixed potential providing portion for providing a fixed potential to the first conductive type insulated island region,
   wherein the fixed potential providing portion is formed along a circumference of the insulated island region.

7. A semiconductor device according to claim 6, further comprising a second conductive type semiconductor layer formed in a surface of the first conductive type insulated island region located under the pad.

8. A semiconductor device according to claim 6, wherein the pad receives an input signal to be inputted to a semiconductor circuit formed in the semiconductor device or an output signal to be outputted from a semiconductor circuit formed therein.

9. A semiconductor device according to claim 6, wherein the fixed potential providing portion comprises a first conductive type semiconductor region formed in a surface of the insulated island region and an electrode which is in contact with the semiconductor region and receives the fixed potential from a power source.

10. A semiconductor device according to claim 9, wherein the semiconductor region has an impurity concentration higher than that of a surface portion of the insulated island region.

11. A semiconductor device comprising:
    a semiconductor substrate having a first conductive type insulated island region which is insulated and isolated from other semiconductor regions therein by an insulating isolation film, wherein said insulated island region has a first conductive type high impurity concentration layer and a first conductive type low impurity concentration layer formed on the high impurity concentration layer;
    a pad formed on the first conductive type insulated island region interposing an insulating film therebetween; and
    a fixed potential providing portion for providing a fixed potential to the first conductive type insulated island region.

12. A semiconductor device according to claim 11, further comprising a second conductive type semiconductor layer formed in a surface of the first conductive type insulated island region located under the pad.

13. A semiconductor device according to claim 11, wherein the pad receives an input signal to be inputted to a semiconductor circuit formed in the semiconductor device or an output signal to be outputted from a semiconductor circuit formed therein.

14. A semiconductor device according to claim 11, wherein the fixed potential providing portion comprises a first conductive type semiconductor region formed in a surface of the insulated island region and an electrode which is in contact with the semiconductor region and receives the fixed potential from a power source.

15. A semiconductor device according to claim 14, wherein the semiconductor region has an impurity concentration higher than that of a surface portion of the insulated island region.

16. A semiconductor device comprising:
a semiconductor substrate having a first conductive type insulated island region which is insulated and isolated from other semiconductor regions therein by an insulating isolation film;
a pad formed on the first conductive type insulated island region interposing an insulating film therebetween;
a second conductive type semiconductor layer formed in a surface of the first conductive type insulated island region located under the pad; and
a fixed potential providing portion for providing a fixed potential to the first conductive type insulated island region, wherein the second conductive type is a p type and the fixed potential is a maximum potential of the semiconductor device.

17. A semiconductor device according to claim 16, wherein the pad receives an input signal to be inputted to a semiconductor circuit formed in the semiconductor device or an output signal to be outputted from a semiconductor circuit formed therein.

18. A semiconductor device according to claim 16, wherein the fixed potential providing portion comprises a first conductive type semiconductor region formed in a surface of the insulated island region and an electrode which is in contact with the semiconductor region and receives the fixed potential from a power source.

19. A semiconductor device according to claim 18, wherein the semiconductor region has an impurity concentration higher than that of a surface portion of the insulated island region.

20. A semiconductor device according to claim 16, wherein the fixed potential providing portion is formed along a circumference of the insulated island region.

21. A semiconductor device according to claim 16, wherein the insulated island region has a first conductive type high impurity concentration layer and a first conductive type low impurity concentration layer formed on the high impurity concentration layer.

22. A semiconductor device comprising:
a semiconductor substrate having a first conductive type insulated island region which is insulated and isolated from other semiconductor regions therein by an insulating isolation film;
a pad formed on the first conductive type insulated island region interposing an insulating film therebetween;
a second conductive type semiconductor layer formed in a surface of the first conductive type insulated island region located under the pad; and
a fixed potential providing portion for providing a fixed potential to the first conductive type insulated island region, wherein the second conductive type is an n type and the fixed potential is a minimum potential of the semiconductor device.

23. A semiconductor device according to claim 22, wherein the minimum potential is a ground potential.

24. A semiconductor device according to claim 22, wherein the pad receives an input signal to be inputted to a semiconductor circuit formed in the semiconductor device or an output signal to be outputted from a semiconductor circuit formed therein.

25. A semiconductor device according to claim 22, wherein the fixed potential providing portion comprises a first conductive type semiconductor region formed in a surface of the insulated island region and an electrode which is in contact with the semiconductor region and receives the fixed potential from a power source.

26. A semiconductor device according to claim 25, wherein the semiconductor region has an impurity concentration higher than that of a surface portion of the insulated island region.

27. A semiconductor device according to claim 22, wherein the fixed potential providing portion is formed along a circumference of the insulated island region.

28. A semiconductor device according to claim 22, wherein the insulated island region has a first conductive type high impurity concentration layer and a first conductive type low impurity concentration layer formed on the high impurity concentration layer.

29. A semiconductor device comprising:
a semiconductor substrate having a first conductive type insulated island region which is insulated and isolated from other semiconductor regions therein by an insulating isolation film;
a pad formed on the first conductive type insulated island region;
a fixed potential providing portion for providing a fixed potential to the first conductive type insulated island region,
wherein the pad is electrically connected to the insulated island region via a diode using the first conductive type insulated island region as a constituting element.

30. A semiconductor device according to claim 29, further comprising an insulating layer disposed between the first conductive type insulated island region and the pad, wherein an opening is formed in the insulating layer therebetween, and the pad is formed in the opening.

31. A semiconductor device according to claim 29, wherein the diode is formed by a second conductive type semiconductor layer, which is formed in a surface of the first conductive type insulated island region, and the first conductive type insulated island region.

32. A semiconductor device according to claim 31, wherein the pad is in contact with the second conductive type semiconductor layer.

33. A semiconductor device according to claim 29, wherein the a fixed potential providing portion is constituted by a first conductive type semiconductor region formed in a surface of the insulated island region and an electrode which is in contact with the semiconductor region and receives the fixed potential from a power source.

34. A semiconductor device according to claim 33, wherein the semiconductor region has an impurity concentration higher than that of a surface portion of the insulated island region.

35. A semiconductor device according to claim 29, wherein the fixed potential providing portion is formed along a circumference of the insulated island region.

36. A semiconductor device according to claim 29, wherein the insulated island region has a first conductive type high impurity concentration layer and a first conductive type low impurity concentration layer formed on the high impurity concentration layer.

37. A semiconductor device according to claim 31, wherein the second conductive type is a p type and the fixed potential is a maximum potential of the semiconductor device.

38. A semiconductor device according to claim 31, wherein the second conductive type is an n type and the fixed potential is a minimum potential of the semiconductor device.

39. A semiconductor device according to claim 38, wherein the minimum potential is a ground potential.

* * * * *